United States Patent [19]

Schindler et al.

[11] Patent Number: 5,008,775
[45] Date of Patent: Apr. 16, 1991

[54] SENSOR AND CONTROL MODULE WITH IMPROVED SENSOR ISOLATION

[75] Inventors: Juergen Schindler, Gross-Gerau-Wallerstaedten; Hartwig Heinen, Bruchkoebel, both of Fed. Rep. of Germany

[73] Assignee: Honeywell Regelsysteme GmbH, Fed. Rep. of Germany

[21] Appl. No.: 405,481

[22] Filed: Sep. 11, 1989

[30] Foreign Application Priority Data

Sep. 13, 1988 [DE] Fed. Rep. of Germany ... 8811566[U]

[51] Int. Cl.$^5$ .............................................. H05K 7/20
[52] U.S. Cl. .......................... 361/383; 236/DIG. 19; 338/22 R; 361/395; 374/185; 374/208
[58] Field of Search .......................... 338/22 R, 25, 31; 236/DIG. 19, 46 R, 94; 116/216; 361/331, 380, 382, 383, 395, 399; 174/16.1; 374/100, 102, 114, 170, 171, 173, 183, 185, 208; 307/113

[56] References Cited

U.S. PATENT DOCUMENTS

| | | | |
|---|---|---|---|
| 3,232,112 | 2/1966 | Wehlau | 236/DIG. 19 |
| 3,462,553 | 8/1969 | Spranger | 361/383 |
| 4,506,827 | 3/1985 | Jamieson | 236/46 R |
| 4,751,961 | 6/1988 | Levine | 236/47 |

FOREIGN PATENT DOCUMENTS 0199925 12/1982 Japan .......................... 236/DIG. 19

Primary Examiner—Gerald P. Tolin
Attorney, Agent, or Firm—Mitchell J. Halista; Clyde C. Blinn

[57] ABSTRACT

A sensor and control module have a housing with an internally mounted printed circuit board which supports a sensing element located in an outwardly projecting hollow portion formed at the lower part of the housing. The projecting portion is prism-shaped and includes air intake slots at its bottom side to enable external air to reach the element. The upper side of the projecting portion which is adjacent to control elements on the module is sealed. The housing is provided with an internal air passage adjacent to the printed circuit board between the air intake slots and air exit slots at a top side of the housing spaced from the control elements. In one embodiment, the module is a thermostat, and the sensing element is a temperature responsive resistor used to sense air temperature.

7 Claims, 2 Drawing Sheets

SENSOR AND CONTROL MODULE WITH IMPROVED SENSOR ISOLATION

BACKGROUND OF THE INVENTION

Field of the Invention

The present invention relates to a sensor and control module. More specifically, the present invention is directed to a sensor and control module containing a sensor and supporting control elements on an external surface.

SUMMARY OF THE INVENTION

An object of the present invention is to provide an improved housing for a sensor and control module.

In accomplishing this and other objects, there has been provided, in accordance with the present invention, a sensor and control module comprising a housing, at least one sensing element, at least one manually actuable control element located on an exterior surface of said housing and a hollow outwardly extending projection of the housing containing the element and located on the front side of the housing at the lower part of the housing with the control elements being arranged above the projection.

BRIEF DESCRIPTION OF THE DRAWINGS

A better understanding of the present invention may be had when the following detailed description is read in connection with the accompanying drawings, in which.

DESCRIPTION OF THE PREFERRED EMBODIMENT

Figure 2:
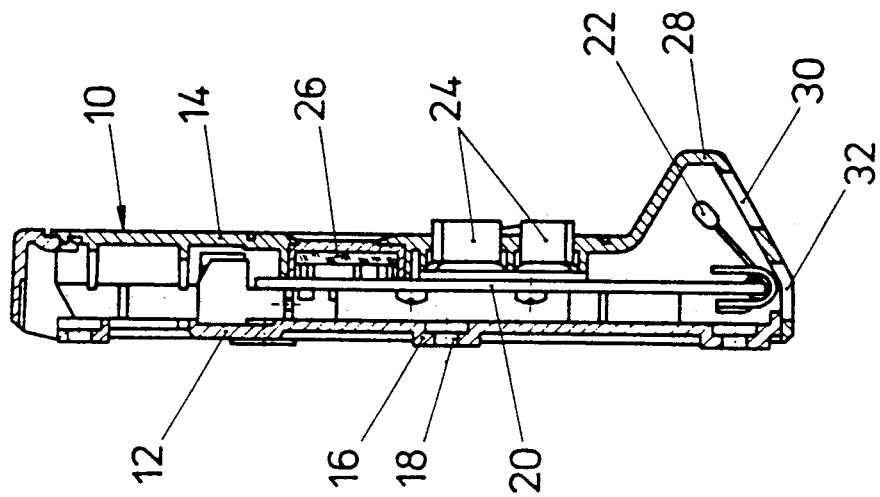
FIG. 2 is a longitudinal cross-section of the module shown in FIG. 1
Figure 1:
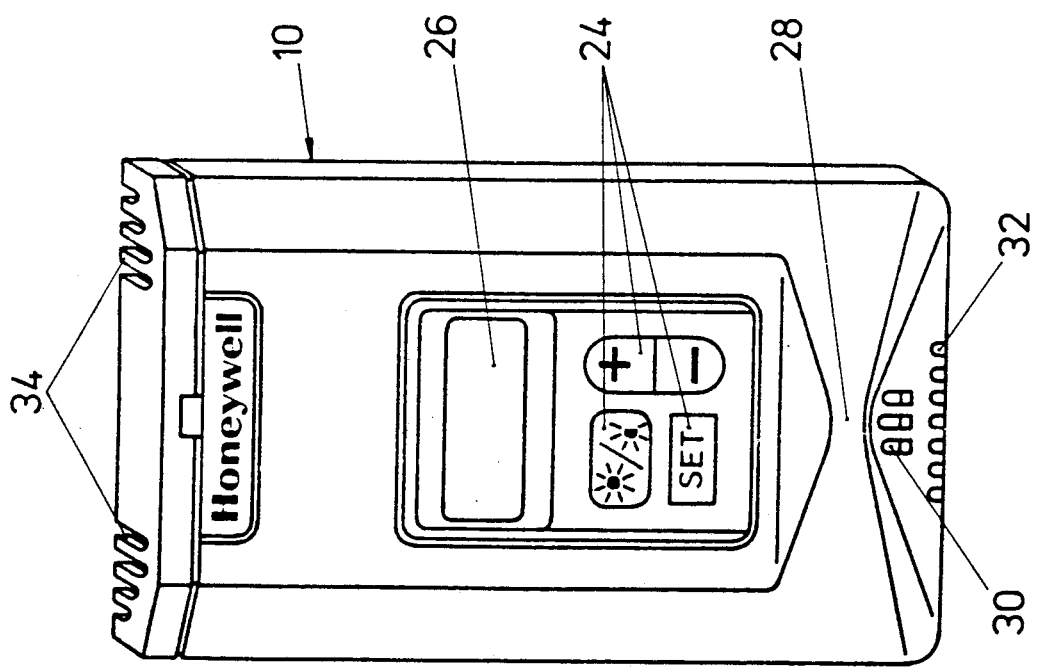
FIG. 1 is a front pictorial view of a sensor and control module embodying an example of the present invention
Figure 3:
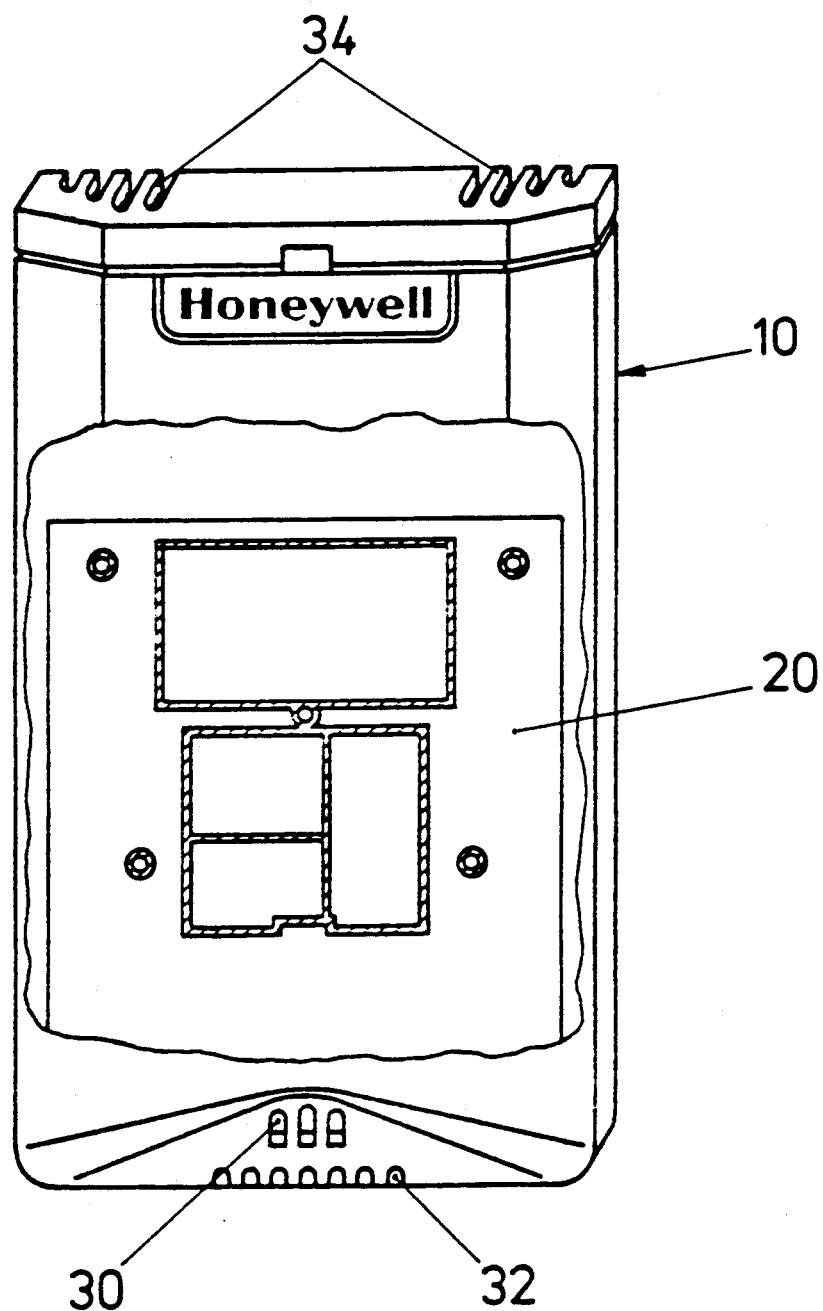
FIG. 3 is a partial internal front view of the module shown in FIG. 1.

Referring to FIGS. 1 to 3, a sensor and control module 10 comprises a housing which consists of a base plate 12 and a cover 14 firmly attached to the base plate 12. The base plate 12 includes elevated lugs 16 with stepped holes 18, by means of which it is fixed by any suitable means not shown, e.g., screws, to a wall of an enclosure to be monitored by the sensor.

The present invention relates to a sensor and control module which is mounted within an enclosure for monitoring an environmental variable within the enclosure. If such a module comprises a sensing element for detecting an actual value, e.g., a room temperature, then it is desirable that this sensing element actually is sensing the room temperature and not, for instance, the temperature of a wall on which the module is mounted. Furthermore, it is desirable that, in the event where manually operable control elements are provided at the module, the heat of an operator's hand does not affect the temperature-sensing element. It is, therefore, the object of the present invention to provide a sensor and control module of the above-indicated type wherein that the sensing element contained within said module is sensing the actual environmental value without being affected by undesired external influences.

A printed circuit board 20 is connected to the cover 14 and supports a temperature sensing element 22, e.g., a temperature responsive resistor, as well as control elements 24 and a LCD display 26, which are accessible from the front side of the cover 14. An outwardly projecting prism-shaped portion 28 extends from the cover 12 below the control elements 24. This projection 28 is provided at its lower side with air intake slots 30 and 32, through which the room air is admitted to reach the temperature-sensing element 22. The air flow continues via an air passage at the rear side of the circuit board 20 to air exit slots 34 which are provided at the upper side of the cover 14. The circuit board 20 extends only over a portion of the total internal width of the housing 12, 14 so that the air passing over the temperature-sensing element 22 may pass laterally to the circuit board 20 and can exit at the air exit slots 34. The air entering through the air intake slots 32 and passing at the rear side of the circuit board 20 to the air exit slots 34 generates a chimney draft effect to enhance the air flow. It is obvious that instead of the control elements in form of a keyboard 24, also other control elements, as, e.g., an adjusting potentiometer with a rotary knob, may be provided above the projecting portion 28, whereby the manual operation of the control element remains without influence on the temperature-sensing element 22 within the projecting portion 28 which is only provided at its bottom side with air intake slots and is sealed at its upper side adjacent to the control element.

Accordingly, it may be seen that there has been provided, in accordance with the present invention, an improved sensor and control module.

The embodiments of the present invention in which an exclusive property or privilege is claimed are defined as follows:

1. A sensor and control module comprising a housing having air slots in the upper and lower portions, at least one sensing element located in the lower portion of said housing,
    a control circuit board producing heat mounted in said upper portion and said lower portion of said housing and connected to said sensing element, at least one manually actuable control element located on an exterior surface of said housing and connected to said circuit board, whereby said housing provides a chimney effect as heat of said circuit board causes air to be drawn through said air slots of said lower portion past said sensing element and said circuit board to exit through said air slots in said upper portion.

2. A module according to claim 1 wherein said air intake slots are arranged in two sets, whereat one set is arranged in a plane in front of the plane of said circuit board and the other set is arranged in a plane behind the plane of said circuit board.

3. A module according to claim 2 wherein said circuit board only extends over a portion of an internal width of said housing and that said air exit slots each are arranged laterally at the upper side of said housing.

4. A module according to claim 1 wherein said sensing element is a temperature responsive resistor.

5. A module according to claim 1 wherein said control elements include a plurality of manually actuable switches and an LCD display.

6. A module according to claim 1 wherein said housing includes a cover having said projection formed therein and a base plate means for supporting said cover and mounting the module on a surface.

7. A module according to claim 1 further comprising a hollow outwardly extending projection of said housing containing said sensing element, said projection located on the front side and in the lower portion of said housing, wherein said projection includes said intake slots in its lower portion and is sealed in its upper side.

* * * * *